United States Patent
Yu et al.

(10) Patent No.: US 7,943,456 B2
(45) Date of Patent: May 17, 2011

(54) SELECTIVE WET ETCH PROCESS FOR CMOS ICS HAVING EMBEDDED STRAIN INDUCING REGIONS AND INTEGRATED CIRCUITS THEREFROM

(75) Inventors: Shaofeng Yu, Plano, TX (US); Freidoon Mehrad, Plano, TX (US); Brian K. Kirkpatrick, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/347,173

(22) Filed: Dec. 31, 2008

(65) Prior Publication Data

US 2010/0164005 A1 Jul. 1, 2010

(51) Int. Cl.
*H01L 21/8238* (2006.01)
*H01L 29/80* (2006.01)
(52) U.S. Cl. ........ 438/199; 438/301; 257/274; 257/338; 257/E21.632; 257/E21.634; 257/E21.619
(58) Field of Classification Search ............... 438/197, 438/199, 300, 301, 307; 257/274, 288, 338; 257/E21.632, E21.634, E21.619
See application file for complete search history.

(56) References Cited

U.S. PATENT DOCUMENTS

| 7,060,576 | B2 | 6/2006 | Lindert et al. | |
|---|---|---|---|---|
| 7,244,654 | B2 | 7/2007 | Chidambaram et al. | |
| 7,315,063 | B2 * | 1/2008 | Lee et al. | 257/338 |
| 2008/0242017 | A1 * | 10/2008 | Lee et al. | 438/231 |
| 2009/0291540 | A1 * | 11/2009 | Zhang et al. | 438/229 |

* cited by examiner

*Primary Examiner* — Hsien-ming Lee
(74) *Attorney, Agent, or Firm* — Warren L. Franz; Wade J. Brady, III; Frederick J. Telecky, Jr.

(57) ABSTRACT

A method for fabricating a CMOS integrated circuit (IC) and ICs therefrom includes providing a substrate having a semiconductor surface including PMOS regions for PMOS devices and NMOS regions for NMOS devices. A gate stack including a gate electrode layer is formed on a gate dielectric layer in or on both the PMOS regions and the NMOS regions. An n-type doping is used to create n-type wet etch sensitized regions on opposing sides of the gate stack in both the PMOS and said NMOS regions. Wet etching removes the n-type wet etch sensitized regions in (i) at least a portion of said PMOS regions to form a plurality of PMOS source/drain recesses or (ii) in at least a portion of said NMOS regions to form a plurality of NMOS source/drain recesses, or (i) and (ii). At least one of a compressive strain inducing epitaxial layer is formed in the plurality of PMOS source/drain recesses and a tensile strain inducing epitaxial layer is formed in the plurality of NMOS source/drain recesses. The fabrication of the IC is then completed.

19 Claims, 6 Drawing Sheets

SELECTIVE WET ETCH PROCESS FOR CMOS ICS HAVING EMBEDDED STRAIN INDUCING REGIONS AND INTEGRATED CIRCUITS THEREFROM

Embodiments of the present invention relate to methods for fabrication of integrated circuits; and, in particular, to integrated CMOS integrated circuits having embedded strain inducing regions for PMOS and/or NMOS devices.

BACKGROUND

It is known that device performance can be improved by adding compressive stress to PMOS devices and tensile stress to NMOS devices. For example, embedded epitaxial SiGe in PMOS source/drain (S/D) regions has become mainstream for PMOS devices in CMOS technology since its implementation around the 90 nm node. Embedded epitaxial SiC in NMOS source/drain (S/D) regions also became mainstream for NMOS devices at around the 45 nm node.

Regarding compressively stressed PMOS devices, the conventional process to incorporate epitaxial S/D compressive stress inducing species (e.g., SiGe) for PMOS devices in CMOS flows usually involves patterning and selective dry etch of the PMOS S/D regions. The extra pattern step is to allow selective substrate (e.g., silicon) etch of the PMOS S/D regions which results in additional cycle time and manufacturing cost. In addition, because the final PMOS transistor performance depends on the shape of the substrate recess formed, plasma dry etch has difficulty in controlling that shape due to lithographic effects such as gate electrode (e.g., polysilicon) pitch dependence and the proximity effect. To form tensile stressed NMOS devices, conventional processing analogous to the above-described processing for forming compressively stressed PMOS devices is generally used. Accordingly, there is a need for new methods to fabricate CMOS integrated circuits (ICs) having compressive stressed PMOS devices and/or tensile stressed NMOS devices, and for CMOS ICs fabricated therefrom.

SUMMARY

This Summary is provided to comply with 37 C.F.R. §1.73, presenting a summary of the invention to briefly indicate the nature and substance of the invention. It is submitted with the understanding that it will not be used to interpret or limit the scope or meaning of the claims.

Embodiments of the present invention describe wet-etch based methods for fabricating CMOS integrated circuit (IC) devices having embedded epitaxial strain inducing regions. A substrate is provided having a semiconductor surface comprising PMOS regions for PMOS devices and NMOS regions for NMOS devices. A gate stack comprising a gate electrode layer on a gate dielectric layer is formed in or on each of the PMOS regions and the NMOS regions. An n-type doping step creates n-type wet etch sensitized regions on opposing sides of the gate stack in both PMOS and NMOS regions. The n-type doping in one embodiment comprises a blanket implant without a masking pattern the simultaneously dopes both the PMOS and NMOS S/D regions.

Wet etching is then used to remove at least a portion of (i) the n-type wet etch sensitized regions in at least a portion of the PMOS regions to form a plurality of PMOS source/drain recesses or (ii) n-type wet etch sensitized regions in at least a portion of said NMOS regions to form a plurality of NMOS source/drain recesses or (i) and (ii). The wet etching can comprises an aqueous solution comprising at least one metal hydroxide, such as $NH_4OH$.

A compressive strain inducing epitaxial layer (e.g., SiGe for PMOS devices) is formed in the plurality of PMOS source/drain recesses and/or a tensile strain inducing epitaxial layer (e.g., SiC for NMOS devices) is formed in the plurality of NMOS source/drain recesses. The fabrication of the IC is then completed.

DETAILED DESCRIPTION OF EXAMPLE EMBODIMENTS

The present invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Figure 1:
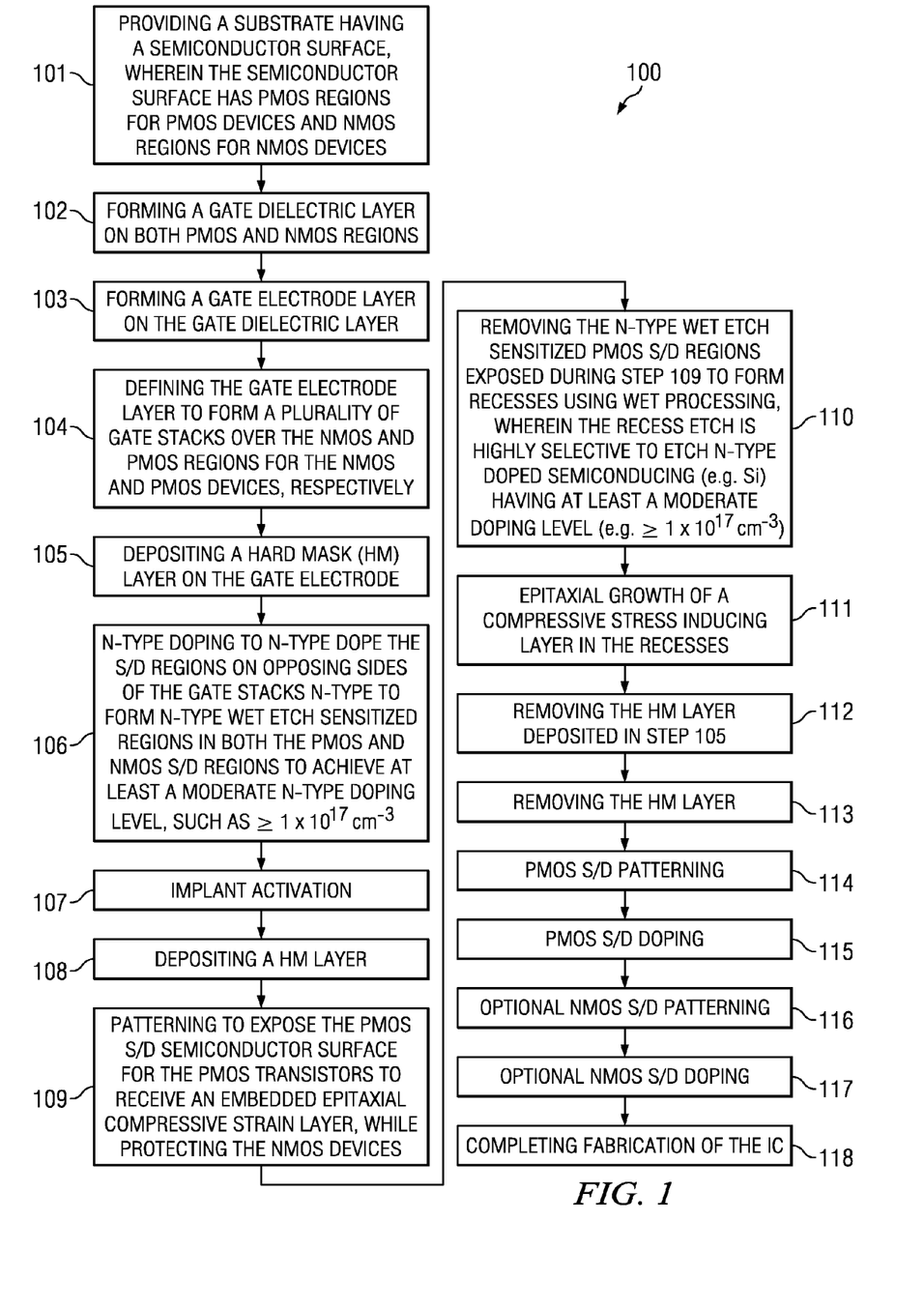
FIG. 1 is a flow chart showing steps in a simplified process flow for forming CMOS ICs comprising PMOS devices having an epitaxial compressive stress layer in the S/D regions of at least a portion of the PMOS devices, according to an embodiment of the invention.

FIG. 1 shows a flow chart illustrating steps in a simplified process flow 100 for forming CMOS ICs comprising PMOS transistor devices having an embedded epitaxial compressive stress layer in the source/drain (S/D) regions in at least a portion of the PMOS devices, according to an example embodiment of the invention. Step 101 comprises providing a substrate having a semiconductor surface, wherein the semiconductor surface has PMOS regions (e.g., lightly doped well regions of n type conductivity) for PMOS transistor devices and NMOS regions e.g., (lightly doped well regions of p-type conductivity) for NMOS devices. The substrate can be a conventional bulk silicon substrate, a silicon on insulator (SOI) substrate, or other suitable substrate.

Step 102 comprises forming a gate dielectric layer on both PMOS (e.g., n-type well) and NMOS (e.g., p-type well) regions. The gate dielectric layer can be a thermally grown dielectric material (e.g., silicon oxide) or can be a deposited gate dielectric material, such as a high-k dielectric material. The high-k dielectric material generally has a k-value >10. Example high-k dielectric materials are hafnium oxide, hafnium silicon oxide, hafnium silicon oxynitride, lanthanum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

A gate dielectric anneal can be performed at the time of the gate dielectric layer formation (step 102), or can comprise a separate step. Step 103 comprises forming a gate electrode layer on the gate dielectric layer. The gate electrode layer can comprise polysilicon, a metal silicide, or another electrically conductive layer. The metal silicide can comprise, for example, tungsten silicide, cobalt silicide, tantalum silicide, titanium silicide, nickel silicide, or platinum nickel silicide. Step 104 comprises defining (viz., patterning) the gate electrode layer to form gate stacks over the NMOS and PMOS regions for the NMOS and PMOS transistor devices, respectively.

Step 105 comprises depositing a hard mask (HM) layer, such as silicon nitride (SiN), silicon oxynitride (SiON) or silicon carbide (SiC)) along with an optional inorganic anti-reflective coating (IARC) on the gate electrode. First spacer processing can follow step 105.

Step 106 comprises n-type doping to form n-type doped S/D regions on opposing sides of the gate stacks to form n-type wet etch sensitized regions in both the PMOS and NMOS S/D regions. The doping achieves at least a moderate n-type doping level, such as $\geq 1\times10^{17}$ atoms cm$^{-3}$. The step 106 doping in one embodiment comprises a simultaneous blanket (i.e., where no masking level is used) implant that simultaneously dopes the S/D regions for both PMOS and NMOS devices. However, in another embodiment of the invention, separate implants are used to form n-type wet etch sensitized regions in the PMOS and NMOS S/D regions. The separate implant embodiment allows different implant parameters to be used (e.g., dose, energy, implant angle) for the PMOS and NMOS S/D regions. The step 106 blanket implant in one embodiment is at a high enough dose (e.g., $>1\times10^{15}$ atoms cm$^2$) to provide sufficient doping levels (e.g., $>1\times10^{20}$ atoms cm$^{-3}$) alone for the NMOS S/D regions, so that no additional S/D implant step (patterning and implant) is generally required. The blanket n-type doping step is generally performed using phosphorous, arsenic or antimony. Step 107 comprises implant activation.

Step 108 comprises depositing a HM layer, such as SiN, SiON, or SiC. Step 109 comprises patterning to expose the PMOS S/D semiconductor surface for the PMOS transistors to receive an embedded epitaxial compressive strain layer, while protecting the NMOS devices. In one embodiment, a portion of the PMOS devices (e.g., peripheral devices) are protected and are thus not exposed at step 109 and as a result do not get etched at step 110 to form recesses and thus do not receive the epitaxial compressive stress inducing layer at step 111 described below. In another embodiment, all PMOS devices are exposed at step 109 and thus get etched at step 110 to form recesses and receive the epitaxial compressive stress inducing layer at step 111.

Step 110 comprises removing the n-type wet etch sensitized PMOS S/D regions exposed during step 109 to form recesses using wet processing, wherein the recess etch is highly selective to etch n-type doped semiconducting (e.g., Si) having at least a moderate doping level (e.g., $\geq 1\times10^{17}$ atoms cm$^{-3}$), while preserving undoped regions (e.g., a polysilicon gates), p-doped semiconducting regions, lightly doped n-regions (e.g., $<10^{16}$ atoms cm$^{-3}$), and dielectric layers such as the gate dielectric and the first spacer. The wet etch can provide at least a 200:1 selectivity for an n-type semiconductor having a moderate doping level (e.g., $\geq 1\times10^{17}$ atoms cm$^{-3}$) relative to undoped polysilicon gates, p-doped semiconducting regions, lightly doped n-regions, and typical first spacer and gate dielectric layers. This etch generally removes most of the additional n-type doping in the PMOS S/D regions, up to a dopant concentration determined by the doping distribution present in the PMOS S/D regions at step 110, which as known in the art can generally be well controlled through selection of ion implantation and annealing parameters. The recess etch follows the doping profile in the substrate, generally stopping at a particular threshold doping concentration level, such as, for example, $\geq 1\times10^{17}$ atoms cm$^{-3}$, $\geq 5\times10^{17}$ atoms cm$^{-3}$, $\geq 1\times10^{18}$ atoms cm$^{-3}$, $\geq 5\times10^{18}$ atoms cm$^{-3}$, $\geq 1\times10^{19}$ atoms cm$^{-3}$, or $\geq 5\times10^{19}$ atoms cm$^{-3}$.

The wet etch can comprises an aqueous basic etch solution. The etch solution can comprise a hydroxide. The hydroxide can comprise a metal hydroxide, and in one embodiment a non-alkali metal comprising hydroxide, such as NH$_4$OH or an organic non-alkali metal comprising hydroxide such as tetramethylammonium hydroxide (TMAH). The hydroxide can also comprise an alkali hydroxide comprising a group IA (except H) or group IIA metal. However, alkali hydroxide etching unlike non-alkali hydroxide etching, generally adds a subsequent step to remove the alkali metal. In one embodiment of the invention the etch solution can comprise a 1:20 to 1:1,000 hydroxide in water solution, with a typical etch solution being a 1:50 solution. Very dilute solutions (e.g., around 1:200 to 1:1,000) are still generally effective, although the etch rate is generally low, thus generally significantly adding to the processing time. In one particular embodiment, the etch solution comprises a 1:20 to 1:200 NH$_4$OH to deionized (DI) water solution. Unless noted otherwise, all liquid ratios used herein refer to concentrated solutions. NH$_4$OH and most other hydroxides generally do not attack most photoresists.

Step 111 comprises epitaxial growth of a compressive stress inducing layer in the recesses. The epitaxial growth can include in-situ doping (p+ heavily doped p-type doping for PMOS regions) in one embodiment. In the case of a Si substrate, the compressive stress inducing epitaxial layer can be SiGe or SiGeC where C is at a low concentration (e.g., <1 at. %). Step 112 comprises removing the HM layer that is deposited in step 105. A second spacer can be formed after step 112. Step 113 comprises removing the HM layer, such as a IARC/HM stack on the gate electrode layer. Step 114 comprises PMOS S/D mask patterning. Step 115 comprises PMOS S/D doping, such as patterning a mask and performing a p+ implantation through the patterned mask. However, if step 111 comprises in situ doping, steps 114 and 115 may be optional.

Step 116 comprises an optional NMOS S/D patterning and step 117 comprises an optional NMOS S/D doping, such as n+ implantation. Steps 116 and 117 are generally performed if the blanket implant dose at step 106 is $<1\times10^{15}$ atoms cm$^{-2}$, and in some embodiments are still performed even if the blanket implant dose at step 106 is $>1\times10^{15}$ atoms cm$^{-2}$. Step 118 comprises completing fabrication of the IC, generally including silicide formation on the S/D regions and the gate electrode layer in the case of a polysilicon gate, multi-layer metal processing and other back end of the line (BEOL) processing. The processing can also include replacement gate processing.

Figure 2A:
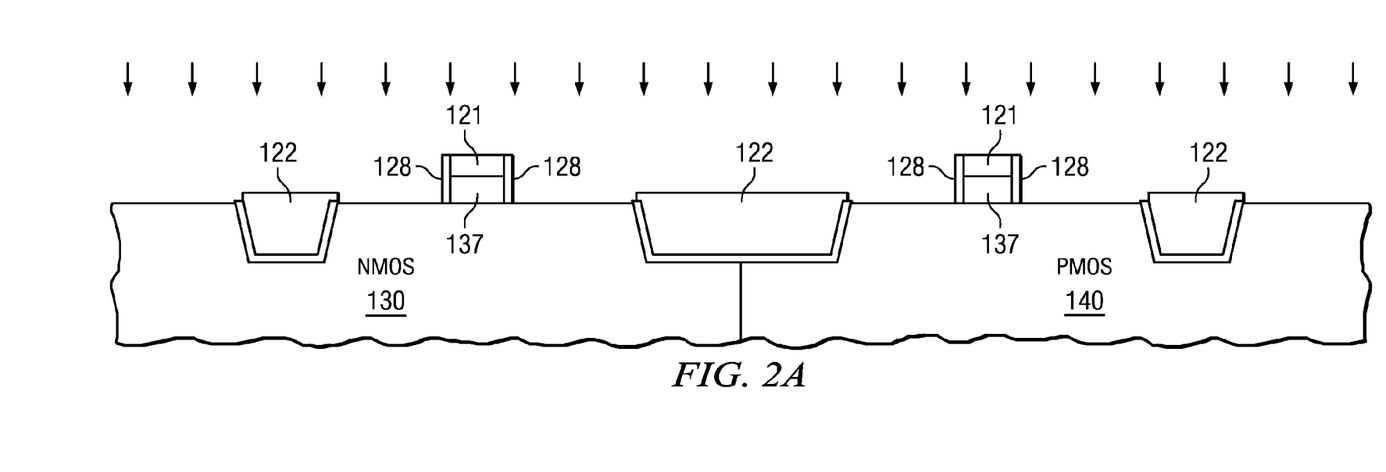
FIGS. 2A-2E are cross-sectional views of intermediate structures for several steps of the process flow described relative to FIG. 1.

FIGS. 2A-2E are cross-sectional views of intermediate structures for several steps of the process steps for flow 100 described relative to FIG. 1. FIG. 2A corresponds to a view during the blanket implant step 106 described in FIG. 1. Note that no patterning layer is present (apart from the gate structures) and that the blanket implant shown results in simultaneous implantation on opposing sides of the gate stacks in the S/D regions for both the PMOS and the NMOS devices shown. The gate structure capping HM layer (e.g., silicon nitride) is shown at 121, and trench isolation regions that electrically isolate the PMOS and NMOS well regions are shown at 122. The gate stack in NMOS region 130 includes a gate electrode 137 on a gate dielectric (not separately identified in FIGS. 2A-2E), with a first spacer 128 on the sidewalls of the gate stack. The gate stack in PMOS region 140 also includes a gate electrode 137 on a gate dielectric, with the first spacer 128 on the sidewalls of the gate stack.

Figure 2B:
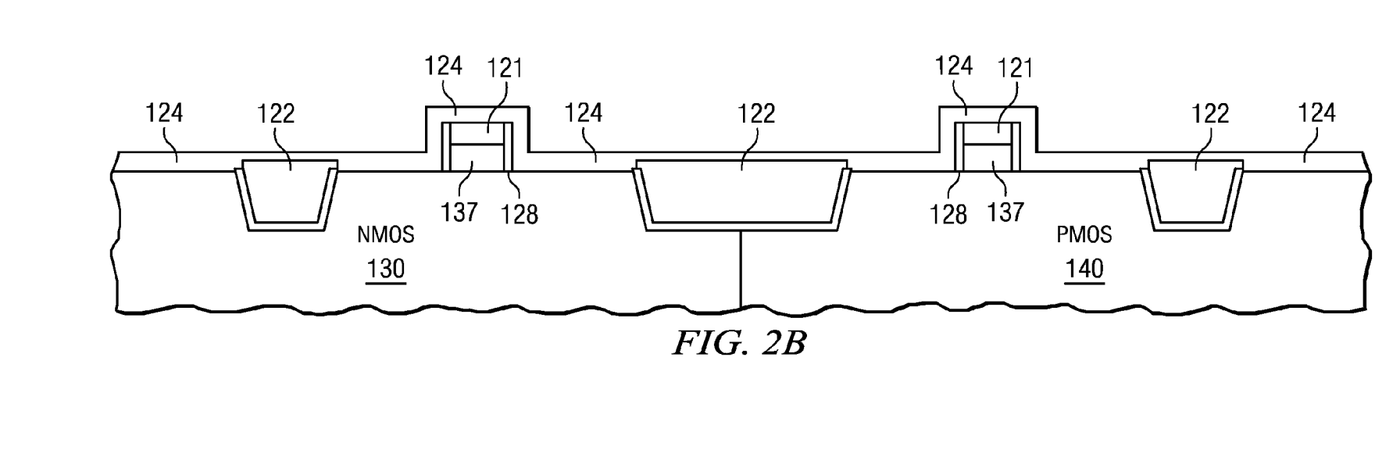
Figure 2C:
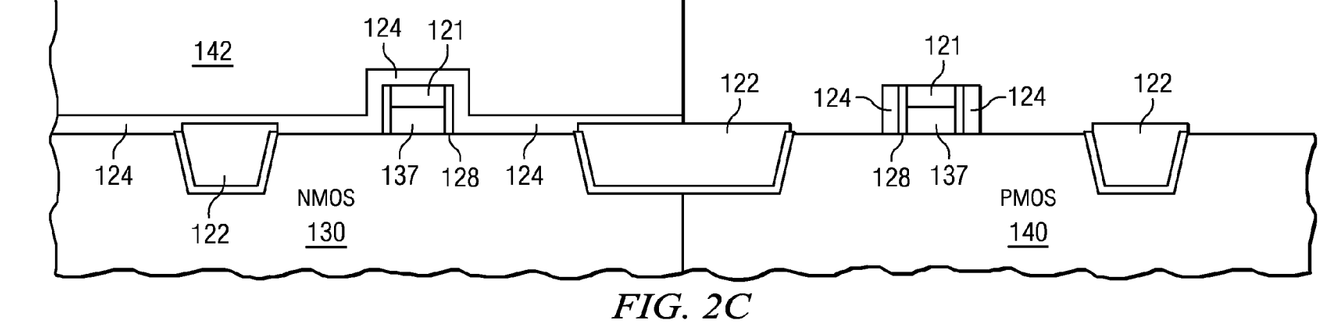
Figure 2D:
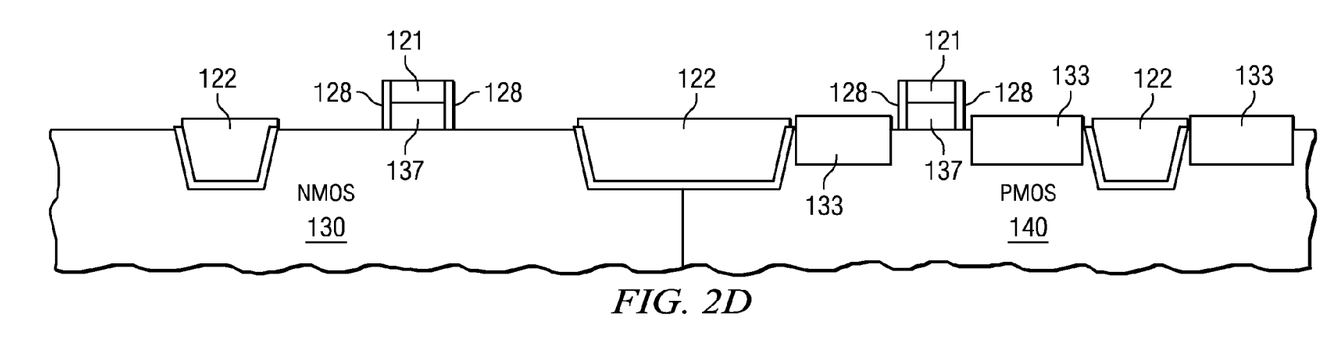
Figure 2E:
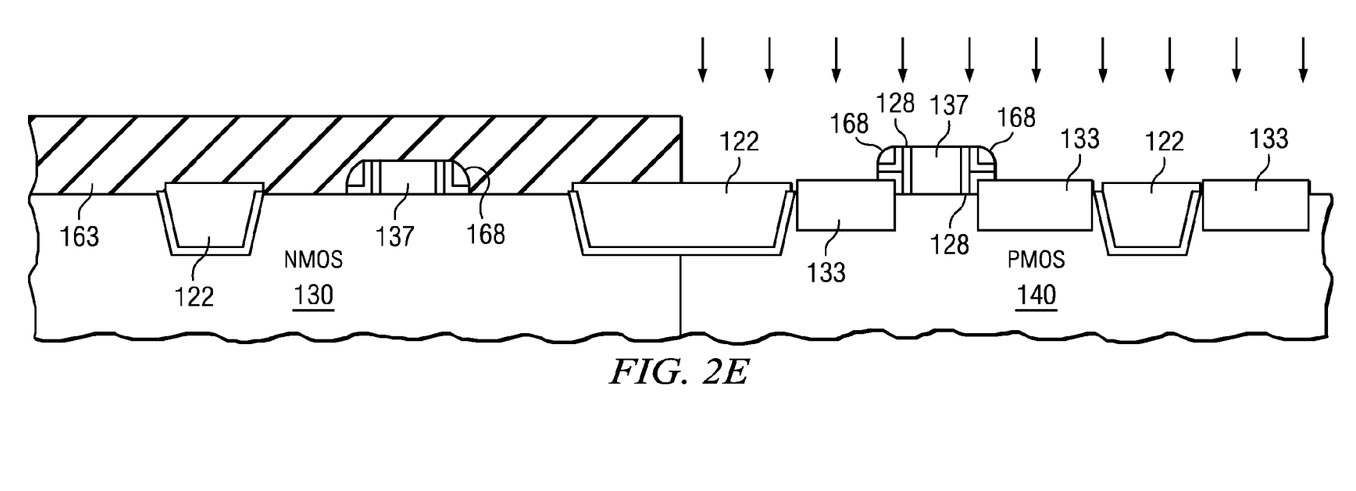

FIG. 2B corresponds to a view after deposition of the HM layer in step 108, while FIG. 2C is a view after the HM layer patterning step 109 and etching of the HM layer 124 from over the PMOS region 140. In one embodiment, the HM layer 124 is patterned by means of a photoresist layer 142 which is formed and patterned over the HM layer 124. FIG. 2D shows the structure after the step 111 epitaxial growth of the embedded compressive strain layer 133 within the recesses in the PMOS region 140 formed during step 110 by removing the regions of the n-type wells which were further doped with n-type dopant in step 106 described relative to FIG. 1. FIG. 2E shows p+ implanting to form the p-type S/D regions of the PMOS region 140 at step 115 described relative to FIG. 1. A masking layer 163 is shown protecting the NMOS region 130 from the p+ implant. As described above, HM layer 121 is removed before p+ implanting. The addition of a second spacer 168 is also shown in FIG. 2E.

Figure 3:
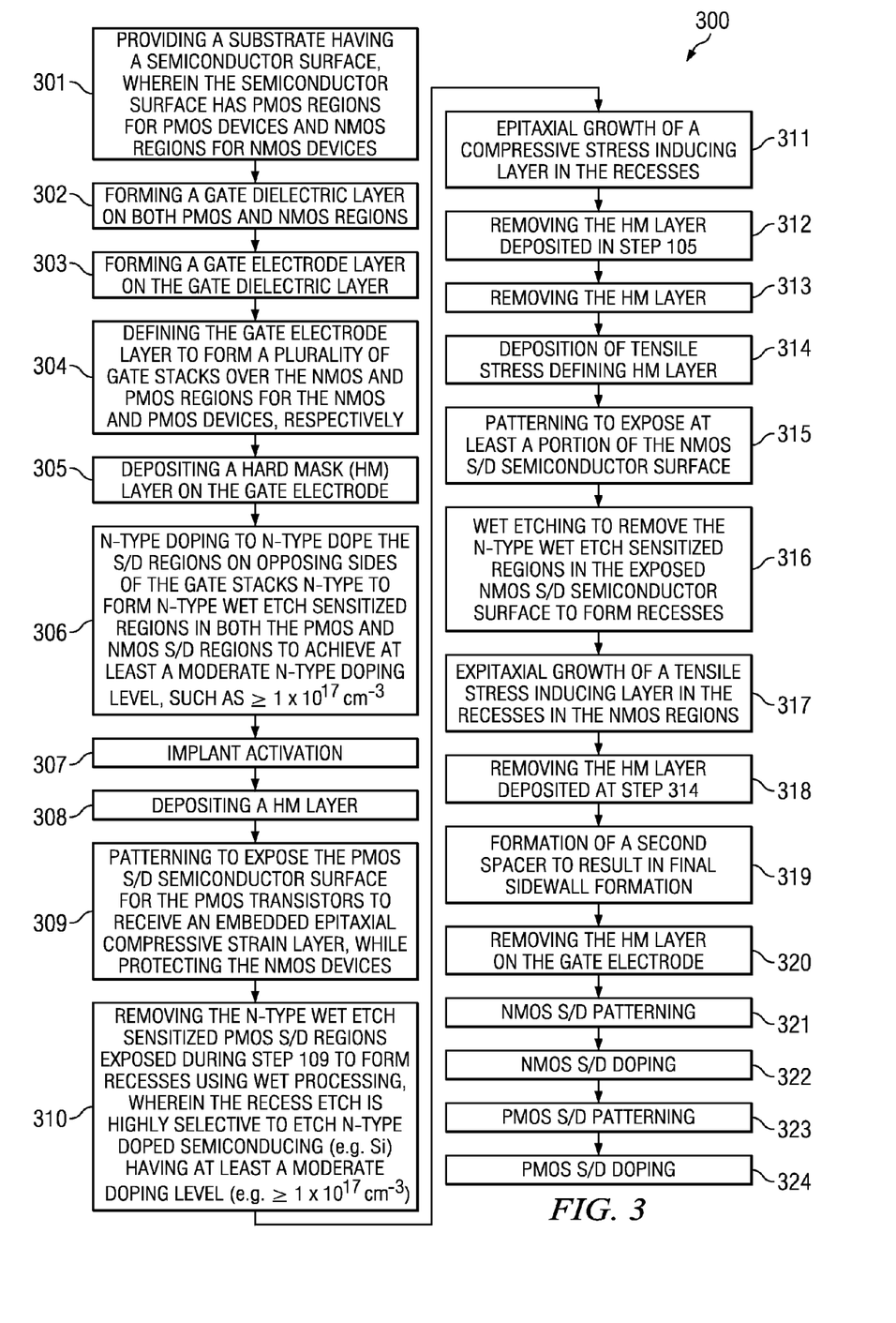
FIG. 3 is a flow chart for a simplified process flow for forming CMOS ICs comprising PMOS devices having an epitaxial compressive stress layer in the S/D regions of at least a portion of the PMOS devices as in the flow of FIG. 1, and further comprising NMOS devices having a tensile stress layer in the S/D regions of at least a portion of the NMOS devices, according to a modified form of the embodiment of FIG. 1 of the invention.

FIG. 3 is a flow diagram of a simplified process flow 300 for forming CMOS ICs comprising PMOS devices having an epitaxial compressive stress layer in the S/D regions of at least a portion of the PMOS devices as already described above, and further comprising NMOS devices having a tensile stress layer in the S/D regions of at least a portion of the NMOS devices, according to a modified form of the embodiment of the process flow 100 of FIG. 1. Steps 101-113 described in flow 100 relative to FIG. 1 which relate to n-type doping, wet etch removal, epitaxial growth replacement and p-type doping of S/D regions to provide compressive stress in the PMOS regions are included in flow 300 and are renumbered as steps 301-313, respectively. Steps 314-322 relate to corresponding wet etch removal, epitaxial growth replacement and doping of S/D regions to provide tensile stress in the NMOS regions.

Step 314 comprises depositing a tensile stress defining HM layer (viz., photoresist layer) analogous to deposition of the compressive stress defining HM layer in step 308 (viz., step 108 in FIG. 1). Step 315 comprises patterning to expose at least a portion of the NMOS S/D regions of the semiconductor surface analogous to step 309 (step 109 in FIG. 1). Step 316 comprises wet etch removal of the n-type wet etch sensitized regions in the exposed NMOS S/D regions of the semiconductor surface to form recesses analogous to step 310 (step 110 in FIG. 1). Step 316 can use the same chemistry described above relative to step 110 in flow 100. Step 317 comprises epitaxial growth of a tensile stress inducing layer in the recesses formed in the NMOS regions analogous to step 311 (step 111 in FIG. 1). In the case of a Si substrate, the tensile stress inducing epitaxial layer can be SiC, or SiGeC where Ge is at a low concentration (e.g., <1 at. %).

Step 318 comprises removing the HM layer deposited at step 314 analogous to step 312 (step 112 in FIG. 1). Step 319 comprises the optional step of a second spacer formation to result in final sidewall formation (cf. FIG. 2E). Step 320 comprises removal of the HM layer on the gate electrode, typically IARC/HM layer on the gate electrode. Steps 321 and 322 are the optional steps of NMOS S/D patterning and step NMOS S/D doping, respectively, analogous to steps 116 and 117 in FIG. 1. Steps 323 and 324 comprise PMOS S/D patterning and PMOS S/D doping, respectively (cf. steps 114 and 115).

Numerous variations will be clear to one having ordinary skill in the art. For example, the order of the NMOS and PMOS S/D patterning and doping can be reversed. Moreover, the formation of the tensile stress inducing layer can precede the formation of the compressive stress inducing layer.

Figure 4:
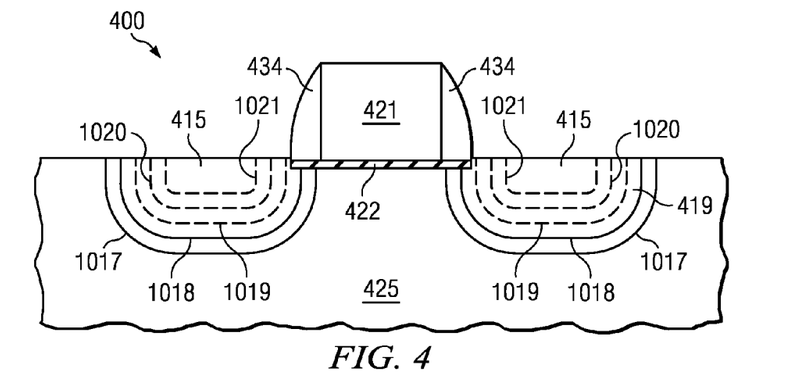
FIG. 4 shows a MOS transistor including an example S/D dopant profile prior to wet recess etch and the resulting cross section of the S/D regions after wet recess etch and epitaxial layer deposition in the recesses showing an example shape of the curved interface formed between the epitaxial stress layer and the substrate portion of the S/D region, according to an embodiment of the invention.

FIG. 4 shows a MOS transistor 400 including an example S/D dopant profile prior to wet recess etch and the resulting cross section of the S/D regions after wet etch recess formation and epitaxial layer deposition in the recesses showing an example shape of the curved interface formed between the epitaxial stress layer and the substrate portion of the S/D regions, according to an embodiment of the invention. The gate electrode layer is shown as 421, the gate dielectric layer as 422, and the spacer as 434. As described above, the shape of the curved interface 419 shown in FIG. 4 is determined by the wet recess etch which removes the n-type doping in S/D regions that has at least a minimum doping concentration, for example, such as at least the doping concentration of $1\times10^{19}$ atoms cm$^{-3}$. Thus, the doping concentration along the curved interface 419 between the epitaxial strain inducing layer 415 and the semiconductor surface layer 425 along a majority of the length and generally the entire length of the curved interface 419 has an n-type doping concentration that is at least $1\times10^{17}$ atoms cm$^{-3}$ and varies no more than ±10% from an average doping concentration along the entire length. The n-type doping concentration is seen to decrease at least one order of magnitude within a short distance (e.g., 0.5 μm) beneath the curved interface 419, such as into the $10^{17}$ range. The profile 1017, 1018, 1019, 1020 or 1020 of the recesses may be set to suit individual needs and preferences by controlling the doping and/or wet etching parameters.

The curved interface 419 shown in FIG. 4 and curved interfaces according to embodiments of the invention also have several other characteristic identifying features. Specifically, the shape of curved interface 419 is distinguishable from interfaces formed by conventional plasma etching or which result in cleaved randomly angled edges. In contrast, curved interfaces according to embodiments of the invention are generally exclusive of cleaved randomly angled edges. Moreover, the shape of the curved interface 419 is not isotropic as it would be from a conventional wet etch since the shape of the curve interface 419 follows the n-type dopant profile, which is generally substantially non-isotropic. As described above, the doping distribution present at the recess etch step can be well controlled through selection of ion implantation and annealing parameters.

Figure 5:
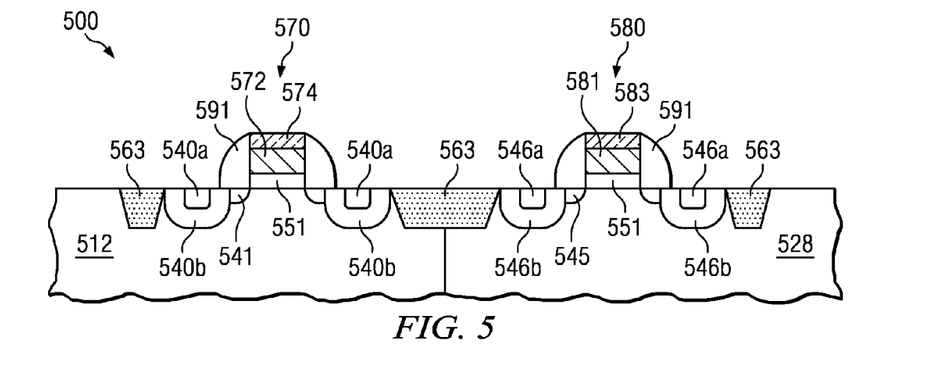
FIG. 5 shows a cross-sectional view of an integrated circuit (IC) according to an embodiment of the invention including a compressively stressed PMOS device and a tensile stressed NMOS device.

FIG. 5 shows a cross-sectional view of an integrated circuit (IC) 500 according to an embodiment of the invention including a compressively stressed PMOS device 570 and a tensile stressed NMOS device 580, shown for an optional replacement gate process. The IC comprises a substrate 512 having a semiconductor surface that includes PMOS regions 512 (e.g., n-type well) for PMOS devices such as PMOS transistor device 570 and NMOS regions 528 (e.g., p-type well) for NMOS devices such as NMOS transistor device 580. Trench isolation regions 563 provide isolation between PMOS and NMOS devices 570, 580.

PMOS device 570 has a gate stack comprising a gate electrode filler material 574/metal replacement gate 572 patterned metal stack over a high-k gate dielectric layer 551, while NMOS device 580 has a gate stack comprising a gate electrode filler material 583/metal replacement gate 581 patterned metal stack over a high-k gate dielectric layer 551. Spacers 591 are shown on the sidewalls of the respective gate stacks. PMOS device 570 includes S/D regions comprising compressive strain inducing epitaxial portions 540a and substrate surface portions 540b having lightly doped drain (LDD) extension regions 541 on opposing sides of the gate stack. NMOS device 580 includes S/D regions comprising tensile strain inducing epitaxial portions 546a and substrate surface portions 546b having LDD extension regions 545 on opposing sides of the gate stack.

Embodiments of the invention generally provide several significant advantages. The embodiments described above are distinguishable from conventional embedded epitaxial layer (e.g., SiGe) process flows in at least three ways. The n-type S/D implant is moved to occur before the embedded epitaxial layer (e.g., SiGe or SiGe and SiC) processing. The n-type S/D implant is a blanket implant that is performed without a masking layer and thus implants the S/D regions of both the NMOS and PMOS devices. In addition, the recesses are formed using a wet etch, such as using hydroxide-based wet chemistry, rather than conventional plasma dry etch processing.

Advantages of embodiments of the invention include lower cost and improved manufacturability since at least one masking level is eliminated. Moreover, transistor performance is generally improved, particularly for PMOS devices, since PMOS transistor behavior is sensitive to substrate (e.g., Si) recess etch shape. Using n-type implants such as n+ implants in one embodiment, the wet recess etch has a high selectivity because it generally follows the dopant profile which can be designed by choice of implant and annealing parameters which allows more precise control of recess formation. Moreover, wet recess etching has less gate electrode (e.g., polysilicon) pitch and proximity dependence as compared to dry etch processing.

Embodiments of the invention can be integrated into a variety of process flows to form a variety of devices and related products. The semiconductor substrates may include various elements therein and/or layers thereon. These can include barrier layers, other dielectric layers, device structures, active elements and passive elements including source regions, drain regions, bit lines, bases, emitters, collectors, conductive lines, conductive vias, etc. Moreover, the invention can be used in a variety of processes including bipolar, CMOS, BiCMOS and MEMS processes.

While various embodiments of the present invention have been described above, it should be understood that they have been presented by way of example only, and not by way of limitation. Numerous changes to the disclosed embodiments can be made in accordance with the disclosure herein without departing from the spirit or scope of the invention. Thus, the breadth and scope of the invention should not be limited by any of the above described embodiments. Rather, the scope of the invention should be defined in accordance with the claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting of the invention. As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the following claims.

The invention claimed is:

1. A method for fabricating a CMOS integrated circuit (IC) comprising devices having embedded epitaxial strain inducing regions, comprising:
    providing a substrate having a semiconductor surface comprising PMOS regions for PMOS devices and NMOS regions for NMOS devices;
    forming gate stacks each comprising a gate electrode layer on a gate dielectric layer, in or on both said PMOS regions and said NMOS regions;
    n-type doping to create n-type wet etch sensitized regions on opposing sides of each of said gate stacks in said PMOS and said NMOS regions;
    wet etching to remove said n-type wet etch sensitized regions in at least a portion of said PMOS regions to form a plurality of PMOS source/drain recesses; and
    forming a compressive strain inducing epitaxial layer in said plurality of PMOS source/drain recesses.

2. The method of claim 1, wherein said n-type doping comprises simultaneously blanket implanting said PMOS and said NMOS regions.

3. The method of claim 2, wherein said simultaneously blanket implanting comprises implanting an n-type specie at a dose of at least $1 \times 10^{13}$ atoms cm$^{-2}$.

4. The method of claim 3, wherein said n-type specie comprises P, As or Sb.

5. The method of claim 2, wherein said simultaneously blanket implanting comprises implanting an n-type specie at a dose of at least $1 \times 10^{15}$ atoms cm$^{-2}$.

6. The method of claim 1, wherein said wet etching comprises etching with an aqueous solution comprising at least one metal hydroxide.

7. The method of claim 6, wherein said metal hydroxide comprises a non-alkali metal hydroxide.

8. The method of claim 7, wherein said non-alkali metal hydroxide comprises $NH_4OH$.

9. The method of claim 8, wherein said wet etch solution comprises a 1:20 to 1:200 solution of said $NH_4OH$ in deionized water.

10. The method of claim 1, wherein said wet etching also removes said n-type wet etch sensitized regions in at least a portion of said NMOS regions to form a plurality of NMOS source/drain recesses, and said method further comprises also forming a tensile strain inducing epitaxial layer in said plurality of NMOS source/drain recesses.

11. The method of claim 10, wherein said wet etching comprises a first wet etch step and a second wet etch step; said first wet etch step removes said n-type wet etch sensitized regions in said portion of said PMOS regions to form said plurality of PMOS source/drain recesses, and is followed by said forming said compressive strain inducing epitaxial layer in said plurality of PMOS source/drain recesses; and said second wet etch step removes said n-type wet etch sensitized regions in said portion of said NMOS regions to form said plurality of NMOS source/drain recesses, and is followed by said forming said tensile strain inducing epitaxial layer in said plurality of NMOS source/drain recesses.

12. The method of claim 10, wherein said compressive strain inducing epitaxial layer comprises SiGe and said tensile strain inducing epitaxial layer comprises SiC.

13. A method for fabricating a CMOS integrated circuit (IC) comprising devices having embedded epitaxial strain inducing regions, comprising:
providing a substrate having a semiconductor surface comprising Si and having PMOS regions for PMOS devices and NMOS regions for NMOS devices;
forming gate stacks each comprising a gate electrode layer on a gate dielectric layer, in or on both said PMOS regions and said NMOS regions;
simultaneously blanket implanting a dose of at least $1\times10^{13}$ atoms $cm^{-2}$ of at least one n-type wet etch sensitizing specie selected from P and As to create n-type wet etch sensitized regions in both said PMOS regions and said NMOS regions on opposing sides of each of said gate stacks;
wet etching with an aqueous solution comprising at least one non-alkali metal hydroxide to remove said n-type wet etch sensitized regions in at least a portion of said PMOS regions to form a plurality of PMOS source/drain recesses; and
forming a compressive strain inducing epitaxial layer comprising SiGe in said plurality of PMOS source/drain recesses.

14. The method of claim 13, wherein said dose is at least $1\times10^{15}$ atoms $cm^{-2}$.

15. The method of claim 13, wherein said non-alkali metal hydroxide comprises $NH_4OH$; and said wet etch solution comprises a 1:20 to 1:200 solution of said $NH_4OH$ in deionized water.

16. A method for fabricating a CMOS integrated circuit (IC) comprising devices having embedded epitaxial strain inducing regions, comprising:
providing a substrate having a semiconductor surface with PMOS and NMOS transistor regions respectively defined by electrically isolated n-type and p-type well regions;
forming a gate dielectric layer over the PMOS and NMOS transistor regions;
forming a gate electrode layer over the gate dielectric layer;
patterning the gate electrode layer to define gate stacks respectively over the PMOS and NMOS transistor regions;
simultaneously implanting n-type dopant into source/drain regions on opposing sides of the gate stacks in both the n-type and p-type well regions, thereby providing n-type doped regions within the n-type well regions having a higher n-type doping than other parts of the n-type well regions;
etching the higher n-type doped regions with an $NH_4OH$ wet etch solution to remove at least part of the higher n-type doped regions without etching the remainder of the n-type well regions in the PMOS transistor regions, thereby forming recesses in the n-type well regions; and
epitaxially growing a compressive stress inducing material within the recesses.

17. The method of claim 16, wherein simultaneously implanting n-type dopant into source/drain regions comprises performing a blanket implant.

18. The method of claim 17, wherein the substrate comprises silicon; and the compressive stress inducting material comprises SiGe or SiGeC.

19. The method of claim 18, wherein the wet etch solution comprises a 1:20 to 1:200 $NH_4OH$ to deionized water solution.

* * * * *